United States Patent
Lovelace

(10) Patent No.: US 9,318,182 B2
(45) Date of Patent: Apr. 19, 2016

(54) APPARATUS, METHOD AND SYSTEM TO DETERMINE MEMORY ACCESS COMMAND TIMING BASED ON ERROR DETECTION

(71) Applicant: John V. Lovelace, Irmo, SC (US)

(72) Inventor: John V. Lovelace, Irmo, SC (US)

(73) Assignee: Intel Corporation, Santa Clara, CA (US)

( * ) Notice: Subject to any disclaimer, the term of this patent is extended or adjusted under 35 U.S.C. 154(b) by 54 days.

(21) Appl. No.: 14/139,558

(22) Filed: Dec. 23, 2013

(65) Prior Publication Data

US 2014/0211579 A1     Jul. 31, 2014

Related U.S. Application Data

(60) Provisional application No. 61/758,482, filed on Jan. 30, 2013.

(51) Int. Cl.

| | |
|---|---|
| *G11C 11/40* | (2006.01) |
| *G11C 11/406* | (2006.01) |
| *G11C 29/02* | (2006.01) |
| *G11C 29/42* | (2006.01) |
| *G11C 29/50* | (2006.01) |
| G11C 29/04 | (2006.01) |

(52) U.S. Cl.
CPC ........ *G11C 11/40607* (2013.01); *G11C 29/023* (2013.01); *G11C 29/028* (2013.01); *G11C 29/42* (2013.01); *G11C 29/50012* (2013.01); *G11C 11/40* (2013.01); *G11C 2029/0409* (2013.01); *G11C 2029/0411* (2013.01); *G11C 2211/4061* (2013.01); *G11C 2211/4062* (2013.01)

(58) Field of Classification Search
CPC ..................................................... G11C 11/406
USPC ........................................................... 365/222
See application file for complete search history.

(56) References Cited

U.S. PATENT DOCUMENTS

| | | | |
|---|---|---|---|
| 6,134,167 A * | 10/2000 | Atkinson | 365/222 |
| 2007/0022244 A1* | 1/2007 | Kimmery | 711/106 |
| 2007/0136544 A1* | 6/2007 | Oda | G06F 13/4243 711/167 |
| 2009/0013127 A1* | 1/2009 | Atkinson | 711/106 |
| 2013/0138870 A1* | 5/2013 | Yoon et al. | 711/103 |
| 2014/0119137 A1* | 5/2014 | Mozak | G11C 5/147 365/189.09 |
| 2014/0153350 A1* | 6/2014 | Boehm et al. | 365/222 |

* cited by examiner

*Primary Examiner* — Min Huang
(74) *Attorney, Agent, or Firm* — Blakely, Sokoloff, Taylor & Zafman LLP

(57) ABSTRACT

Techniques and mechanisms to dynamically adjustment a timing of commands to access a dynamic random access memory (DRAM). In an embodiment, a memory controller monitors an error rate of the DRAM and, based on such monitoring, identifies that the error rate is within a predetermined range. In response to the error rate being within the predetermined range, one or more signals are generated to dynamically modify a command timing setting. In another embodiment, modification of the command timing setting is to transition a memory controller from sending memory refresh commands successively at one rate to sending memory refresh commands successively at a different rate.

25 Claims, 7 Drawing Sheets

APPARATUS, METHOD AND SYSTEM TO DETERMINE MEMORY ACCESS COMMAND TIMING BASED ON ERROR DETECTION

RELATED APPLICATIONS

This application is a nonprovisional application based on U.S. Provisional Patent Application No. 61/758,482 filed Jan. 30, 2013, and claims the benefit of priority of that provisional application. Provisional Application No. 61/758,482 is hereby incorporated by reference.

BACKGROUND

1. Technical Field

Embodiments of the invention relate generally to memory devices, and more particularly, but not exclusively, to performing refreshes for a dynamic random access memory (DRAM).

2. Background Art

Memory devices are ubiquitous for a variety of computer device applications. Dynamic random access memory (DRAM) is commonly used as working memory in computing devices. The working memory is often volatile (it loses state if power is interrupted to the system), and provides temporary storage for data and programs (code) to be accessed and executed by the system processor(s).

There are multiple types and variations of DRAM, one example being synchronous DRAM (SDRAM). Being dynamic, DRAM requires continuous or regular refreshing of the data bits stored in the memory device. The refreshing is generally controlled by a memory controller, which periodically accesses data bits of the memory device. Typically, memory cells in a DRAM are each constructed from a single transistor and a single capacitor. Such memory is called dynamic because its data decays and becomes invalid due to various leakage current paths to surrounding cells and to the substrate. Therefore, to keep the data in the cells valid, each memory cell is periodically refreshed. Data in a DRAM cell array is refreshed every time it is read out of the cell array into the sense amplifiers and subsequently rewritten into the cell. Memory that is not read is refreshed by a specific refresh operation.

The memory controller is responsible for periodically performing refresh maintenance operations on the memory cell array. Every row of the memory array needs to be refreshed before the data in the row decays to an invalid state. During self-refresh mode the DRAM device is responsible for performing the refreshes.

Various factors, such as temperature or process variation, can impact the ability of dynamic random access memory technology to maintain a valid charge in each memory cell over a specified refresh interval. The time spent refreshing DRAM continues to grow with DRAM densities, which impacts isochronous bandwidth and worst case latency. Isochronous bandwidth refers to bandwidth guarantees on the memory subsystem.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Embodiments discussed herein variously provide for dynamic adjustment of a timing for commands to access a memory such as a DRAM. Such adjustment may be based on a monitoring of a rate of data errors during operation of the memory. For example, certain embodiments determine whether a current error rate is within a predetermined range—e.g. including determining whether the error rate is currently above a minimum threshold rate that is associated with DRAM cell failures, and below a maximum threshold rate that is associated with other failure mechanisms. One or more command timing settings may be adjusted based on such determining. For example, certain embodiments may adjust a timing parameter which specifies or otherwise determines a time delay (e.g. an average time delay, a maximum time delay, a minimum time delay or the like) between successive commands to access memory resources.

Such a timing parameter may determine a frequency of commands—e.g. at least for a particular type (or types) of memory access. By way of illustration and not limitation, a timing parameter may be dynamically modified to transition a memory controller from sending memory refresh commands successively at one rate to sending memory refresh commands successively at a different rate. Accordingly, certain embodiments variously provide for intelligent decisions about efficient refresh rates—e.g. based on memory access loads and DRAM configuration. Such adaptive refresh rate setting has various advantages over static settings to deal with DRAM cell failures (where a failure of a DRAM memory cell to maintain a valid charge is referred to herein as a "DRAM cell failure"). One notable advantage is that a memory refresh rate may be changed when DRAM cell failures are detected by elevated data error rates. However, software applications that do not generate stress patterns associated with DRAM cell failures may not be penalized. One net effect of certain embodiments is the availability of improved performance and power consumption for a large percentage of possible system configurations.

Additionally or alternatively, certain embodiments allow for the fact that many memory systems are typically designed to meet specific power and/or thermal constraints, for example. Changing a memory refresh rate to work around the DRAM cell failures may violate power and/or thermal requirements of conventional systems. However, by implementing a dynamic solution in a basic input output system (BIOS), for example, certain embodiments allow other variables such as DIMM temperature and throttling to be be factored into a runtime decision to modify command timings or to activate one or more alternative ECC error handling mechanisms.

Figure 1:
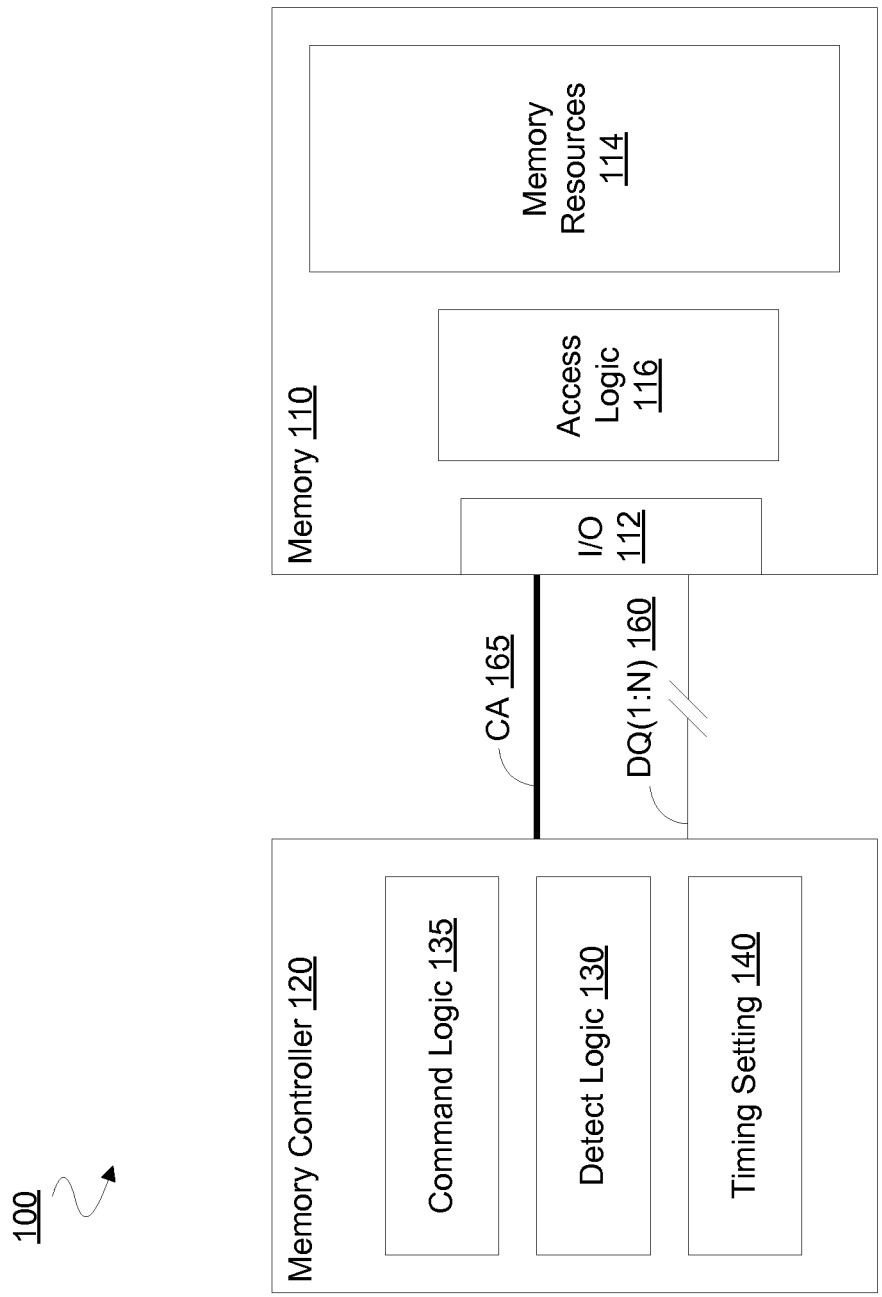
FIG. 1 is a block diagram illustrating elements of a system for providing access to memory resources according to an embodiment.

FIG. 1 illustrates elements of a system 100 for exchanging commands to access volatile memory elements according to an embodiment. System 100 represents any of a number of computing devices that may include a memory controller which supports error detection functionality. Such computing devices may include servers, desktops, laptops, mobile devices, smartphones, gaming devices, and others.

System 100 may include a memory device 110 coupled to a memory controller 120—e.g. where memory controller 120 is to provide access to memory device 110 for a host processor (not shown) which is included in or coupled to system 100. Memory device 110 may include any of a variety of types of memory technology that, for example, have rows of memory cells, where data is accessible via a wordline or the equivalent. In one embodiment, memory device 110 includes dynamic random access memory (DRAM) technology. Memory device 110 may be an integrated circuit package within a larger memory device (not shown) of system 100. For example, memory device 110 may be a DRAM device of a memory module such as a dual in-line memory module (DIMM).

Memory device 110 may include memory resources 114, which represent one or more logical and/or physical groups of memory. An example of one such grouping of memory is a bank of memory resources which, for example, may include an array of storage elements arranged in rows and columns. Memory device 110 may include access logic 116 to facilitate, at least in part, access to memory resources 114—e.g. where such access is provided for servicing one or more commands from memory controller 120. Access logic 116 may include, or operate in conjunction with, logic of memory device 110 which provides resource access according to conventional techniques. By way of illustration and not limitation, access logic 116 may include or couple to column logic and/or row logic (not shown) which are used to decode an access instruction to the proper memory location within memory resources 114.

Memory controller 120 may send commands or instructions to memory device 110 over a one or more buses, as represented by the illustrative command/address (CA) bus 165. Such commands may be interpreted by memory device 110—e.g. including memory device 110 decoding command information to perform a variety of access functions within the memory and/or decoding address information with column logic and/or row logic. For example, such logic may access a specific location in memory resources 114 with a combination of a column address strobe or signal (CAS) and a row address strobe or signal (RAS). Rows of memory may be implemented in accordance with known memory architectures or their derivatives. Briefly, a row of memory resources 114 may include one or more addressable columns of memory cells, as identified by the CAS generated by column logic of memory 110. The rows may each be variously addressable via the RAS generated by row logic of memory 110.

Access to memory resources 114 may be for the purpose of writing data exchanged—and/or reading data to be exchanged—via a data bus coupled to I/O circuitry 112 of memory 110. For example, N data bus signal lines DQ(1:N) 160 may couple I/O circuitry 112 to memory controller 120 and/or one or more other memory devices (not shown).

In an embodiment, memory controller 120 includes command logic 135—e.g. including any of a variety of hardware logic and/or executing software logic—to send commands via CA 165. Command logic 135 may include or couple to logic of memory controller which performs operations to generate, transmit or otherwise determine commands sent according to one or more conventional techniques. By way of illustration and not limitation, command logic 135 may supplement otherwise conventional command/address signaling functionality which, for example, conforms to some or all requirements of a dual data rate (DDR) specification such as the DDR3 SDRAM JEDEC Standard JESD79-3C, April 2008 or the like.

For example, memory controller 120 may include or couple to logic—as represented by the illustrative detect logic 130—comprising circuitry and/or executing software to detect and/or otherwise evaluate data error events associated with accesses to memory 110 by memory controller 120. Thus, detect logic 130 enables memory controller 120 to monitor, track, and possibly store information describing such data errors.

In an embodiment, detect logic 130 enables memory controller 120 to determine conditions under which a rate of accesses to memory 110 may be modified, or needs to be modified. For example, detect logic 130 may include or couple to mechanisms of memory controller 120 which perform error detection and/or error correction for data accessed from memory resources 114—e.g. where such mechanisms perform operations adapted from conventional error handling techniques. Based on such mechanisms, detect logic 130 may monitor a current value for a performance metric including a rate of data errors. In an embodiment, detect logic 130 performs an evaluation to determine whether such a rate of data errors is currently within a predetermined range of error rate values. Such determining may include, for example, identifying whether (or not) the rate of data errors is outside of a different predetermined range of values. Based on such an evaluation, detect logic 130 may recognize whether, for at least one type of access to memory 110, a timing of commands for such access needs to be adjusted (or, alternatively, whether such a timing may be opportunistically adjusted).

In response to determining that the monitored error rate is within a predetermined range, detector logic 130 may generate the one or more signals to dynamically modify a command timing setting for command logic 135. By way of illustration and not limitation, command logic 135 may include or couple to a configurable (e.g. reconfigurable) timing setting 140 which specifies or otherwise indicates a threshold delay period (e.g. representing a minimum delay, a maximum delay, or the like) between successive commands of a given command type.

Detect logic 130 may dynamically modify some or all of timing setting 140 during runtime operation of system 100 to transition command logic 135 from a first timing for first commands to access memory 110 to a second timing (different from the first timing) for second commands to access memory 110. In an embodiment, timing setting 140 defines a timing constraint which is specific to a particular type or types of commands to access memory 110. For example, timing setting 140 may define the timing constraint for only some (i.e. but not all) types of memory access commands.

One example of a parameter in timing setting 140, adapted from conventional techniques, is a refresh period (or refresh interval) tREF. To ensure data integrity in a DRAM's rows (e.g., 64K rows), a refresh command may be executed for each row (e.g., 64K refresh commands) to every memory bank within tREF period. A typical static tREF value for some conventional memory applications is around 64 milliseconds. An additional or alternative example of a parameter in timing setting 140 is an average time tREFI between refresh commands. Conventional mainstream DRAMs tend to have a standard tREFI of approximately 7.8 microseconds, for example. Any of a variety of other timing parameters may be additionally or alternatively modified according to techniques discussed herein.

Figure 2:
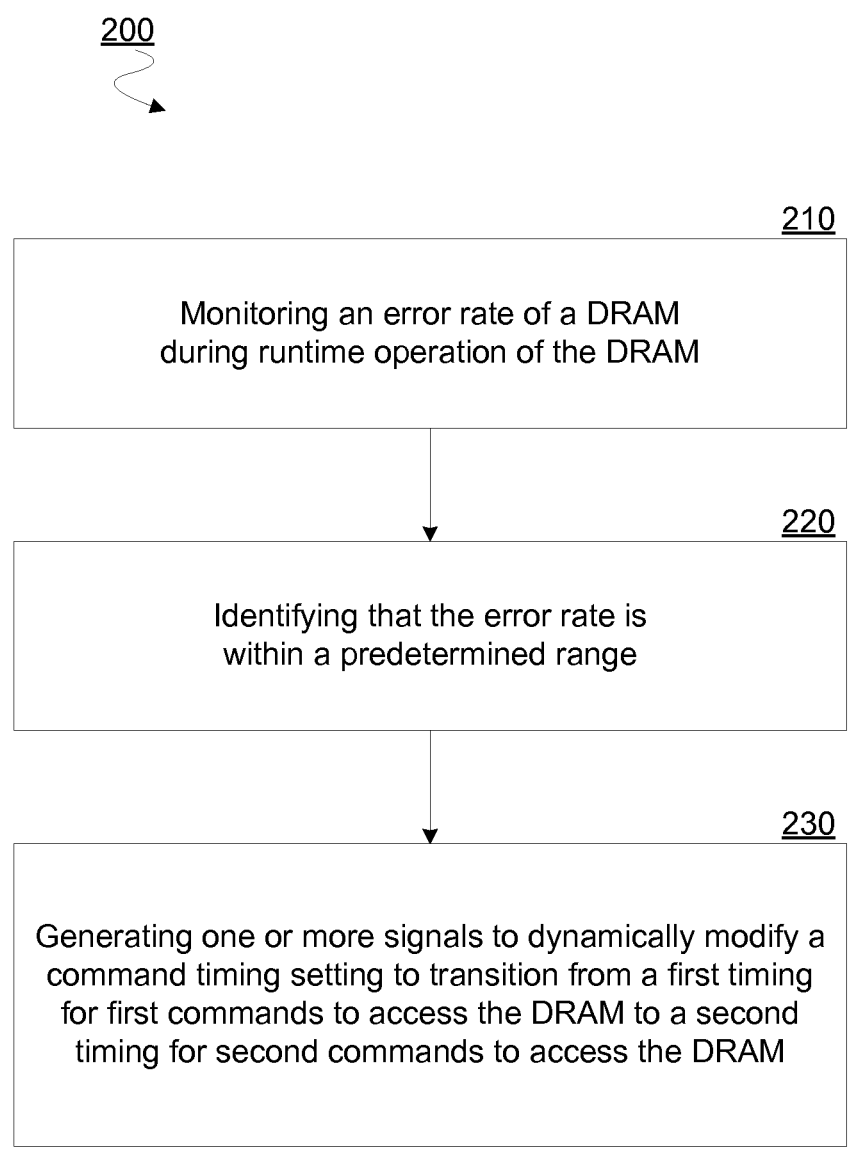
FIG. 2 is a flow diagram illustrating elements of a method for determining a rate of memory accesses according to an embodiment.

FIG. 2 illustrates elements of a method 200 for controlling a memory device according to an embodiment. Method 200 may be performed with a memory controller having some or all of the functionality of memory controller 120. For example, method 200 may be performed to access a memory device having one or more features of memory device 110.

Method 200 may include, at 210, monitoring an error rate of a DRAM during runtime operation of the DRAM. The monitoring at 210 may be performed, for example, with patrol scrub logic of the memory controller which detects for data errors independent of memory access requests from a host. Alternatively or in addition, such monitoring may be performed with demand scrub logic of the memory controller which detects for data errors in the course of servicing memory access requests from such a host.

The monitoring at 210 may include, for example, performing error detection calculations—e.g. according to error checking and correction (ECC) techniques—to evaluate respective data retrieved by first commands to access the DRAM, where the memory controller generates such first commands according to a first timing. By way of illustration and not limitation, an error rate may be determined based on memory accesses each to read a respective one of data D1, . . . , DN variously stored in memory locations of the DRAM. Data D1, . . . , DN may correspond to values p1, . . . , pN, respectively—e.g. where p1, . . . , pN each include a parity, checksum or other such value previously calculated for error detection of the corresponding one of data D1, . . . , DN. Calculation, storing and retrieval of p1, . . . , pN may be adapted from any of various known error detection mechanisms and/or techniques, which are not limiting on certain embodiments. In an embodiment, a respective current parity, checksum or other such value may be calculated for each of the retrieved data D1, . . . , DN, where each such value is compared to a corresponding one of p1, . . . , pN to determine whether a data error is indicated.

The monitoring at 210 may further comprise maintaining a count of data errors based on such error detection calculations. In an embodiment, such a count includes a count of all errors for accesses of a particular access type or types, as distinguished from accesses of one or more other access types. For example, the count may be specific to one set of memory resources—e.g. a particular one or more banks, one or more ranks, one or more DIMMs and/or any of a variety of other sets of memory resources—and not for some other set of memory resources to which the count does not apply. In an embodiment, the monitoring at 210 includes monitoring a rate which is specific to data errors which have been identified as being correctable.

An error rate may be, include or otherwise be based on a count of data errors, a rate of change of such a count, and/or the like. For example, an error rate may be based on a total number A of errors detected for X most recent accesses or, alternatively, a total number B of errors detected for accesses during a most recent time window of duration Y. By way of illustration and not limitation, an error rate may be or otherwise include a rate of change (first order, second order and/or the like) of A over time—e.g. for a running window (or other sequence) of sets of X accesses. Alternatively or in addition, an error rate may be or otherwise include a rate of change of B over time—e.g. for successive groups of accesses in a shifting time window of duration Y. Any of a variety of additional or alternative types of error rates may be monitored at 210, according to different embodiments.

Based on the monitoring at 210, method 200 may perform, at 220, identifying that the error rate is within a predetermined range. The identifying at 220 may include, for example, identifying that a count of data errors (or a rate of change of such a count, or other such error rate) has crossed a threshold level. Although certain embodiments are not limited in this regard, such identifying may be based on evaluation of an error rate as a percentage, fraction or other ratio of a total number of a set of memory accesses.

In response to the identifying at 220, method 200 may further perform, at 230, generating one or more signals to dynamically modify a command timing setting to transition from a first timing for first commands to access the DRAM to a second timing for second commands to access the DRAM. For example, the one or more signals may include a system management interrupt (SMI).

In one embodiment, the one or more signals are generated to increase a rate of accesses to the DRAM by at least one type of command. For example, the generating at 230 may including generating one or more signals to increase a refresh rate for the DRAM. Such an increase may be in response to detecting that an error rate exceeds a maximum threshold for a range of acceptable error rates. Alternatively, the generating at 230 may including generating one or more signals to decrease a refresh rate for the DRAM. Such an increase may be in response to detecting an opportunity to reduce a frequency of memory refreshes to improve a power, temperature and/or other performance characteristics of the DRAM.

Method 200 may include other operations in addition to those represented in FIG. 2—e.g. including operations performed subsequent to the generating at 230. For example, method 200 may further comprise identifying that the error rate remains within the predetermined range. In response, method 200 may activate an error handling mechanism other than one based on the command timing setting which is modified by the generating at 230. For example, such an error handling mechanism may include dynamically configuring (e.g. reconfiguring) an error threshold for the memory controller. Alternatively or in addition, method 200 may identify—subsequent to the generating at 230—that the error rate is within the predetermined range. In response to identifying that the error rate is within the predetermined range, method 200 may generate another one or more signals to again dynamically modify the command timing setting to transition away from the second timing—e.g. to some other timing for commands to access the DRAM.

Figure 3:
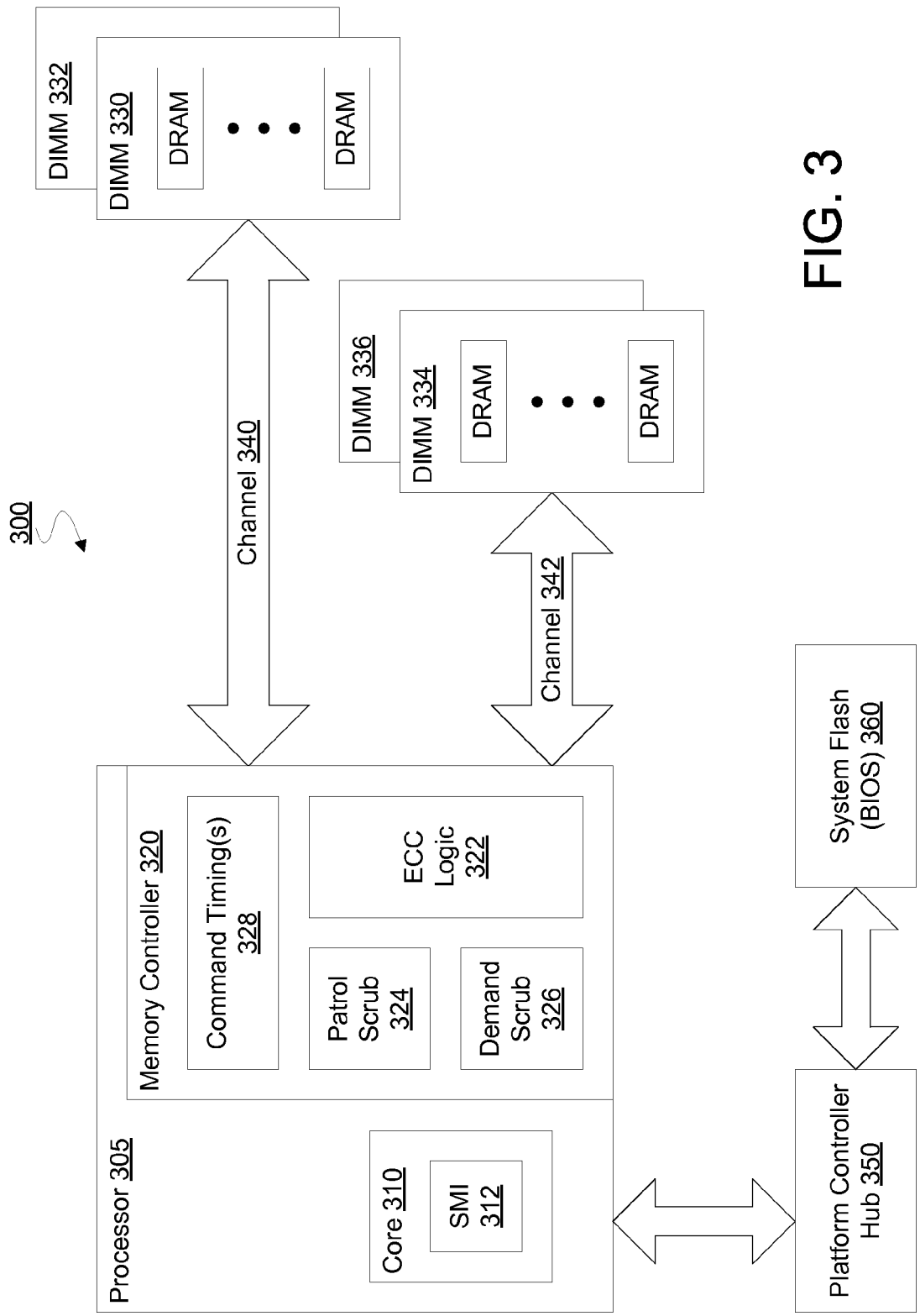
FIG. 3 is a block diagram illustrating elements of a memory controller for controlling access to memory resources according to an embodiment.

FIG. 3 is a block diagram of a system 300 which provides access to dynamic random access memory (DRAM) according to an embodiment. Memory accesses by system 300 may be according to techniques such as those of method 200, for example. In an embodiment, system 300 includes some or all of the features of system 100.

System 300 includes a processor 305, platform controller hub (PCH) 350, DIMMs 330, 332, 334, 336 and system flash memory 360. Each of DIMMs 330, 332, 334, 336 includes a respective plurality of DRAMs. Processor 305 may include a memory controller 320 that supports at least one memory channel, as represented by the illustrative channels 340, 342. Each memory channel connects one or more of DIMMs 330, 332, 334, 336 to processor 305. Memory controller 320 may include patrol scrub logic 324, demand scrub logic 326, error checking and correction (ECC) logic 322 and one or more command timings 328. ECC logic 322 may include or couple to an error counter and a threshold (not shown) capable of generating a SMI event. Processor 305 includes at least one core 310 which includes an SMI event handler 312. System flash 360 (non-volatile memory) may store a basic input output system (BIOS) which includes software instructions that are executed by processor core 310. In an embodiment, processor core 310 executes BIOS software instructions during system boot and for operation of SMI event handler 213.

In an embodiment, the BIOS may respond to SMI events due to correctable data errors and modify a command timing 328 which is for refresh timing by the memory controller 320. In response to an evaluation of an error rate, the BIOS may change (e.g. increase or decrease) the memory refresh rate. For example, the BIOS may modify a timing parameter tREFI of command timings 328 which specifies a time (e.g. maximum time, average time, etc.) between successive refresh commands to at least a particular memory resource.

In an embodiment, the BIOS monitors the data error rate as patrol scrub logic 324 cycles through all memory addresses in DIMMs 330, 332, 334, 336. The BIOS may access a periodic SMI timer (not shown)—e.g. in PCH 350—to measure elapsed time for each patrol cycle. If a data error is detected during a given patrol cycle, the BIOS may detect that the data error is associated with a current (and/or previous) memory refresh rate. If a data error does not occur during the last patrol cycle, then the BIOS may optionally decrease the memory refresh rate.

In an illustrative embodiment, the BIOS tracks average data error rates which are each associated with a previous memory refresh rate during a respective patrol cycle. The BIOS may periodically harvest the data error count from ECC logic 322. The BIOS may track error rates over many patrol cycles and use such historical information to bias an algorithmic decision to change the memory refresh rate. This BIOS may further adapt the memory refresh rate to one or more other factors—e.g. memory access traffic, software workload, DIMM population in system 300 and/or the like—to avoid or otherwise limit power and/or performance penalties such as those associated with static refresh settings for worst-case situations.

In an embodiment, the BIOS may determine that one or more data errors result from a cause or causes other than DRAM cell failure. For example, if a data error rate is very high and cannot be reduced by increasing the memory refresh rate, then the BIOS may deduce that DRAM cell failures are not the root cause of such data errors. In response, the BIOS may configure ECC capabilities in the memory controller 320 to handle other sources of data errors. For example, the BIOS may activate one or more conventional mechanisms of memory controller 320 to eliminate the data error condition and avoid a system failure due to uncorrectable error.

Figure 4A:
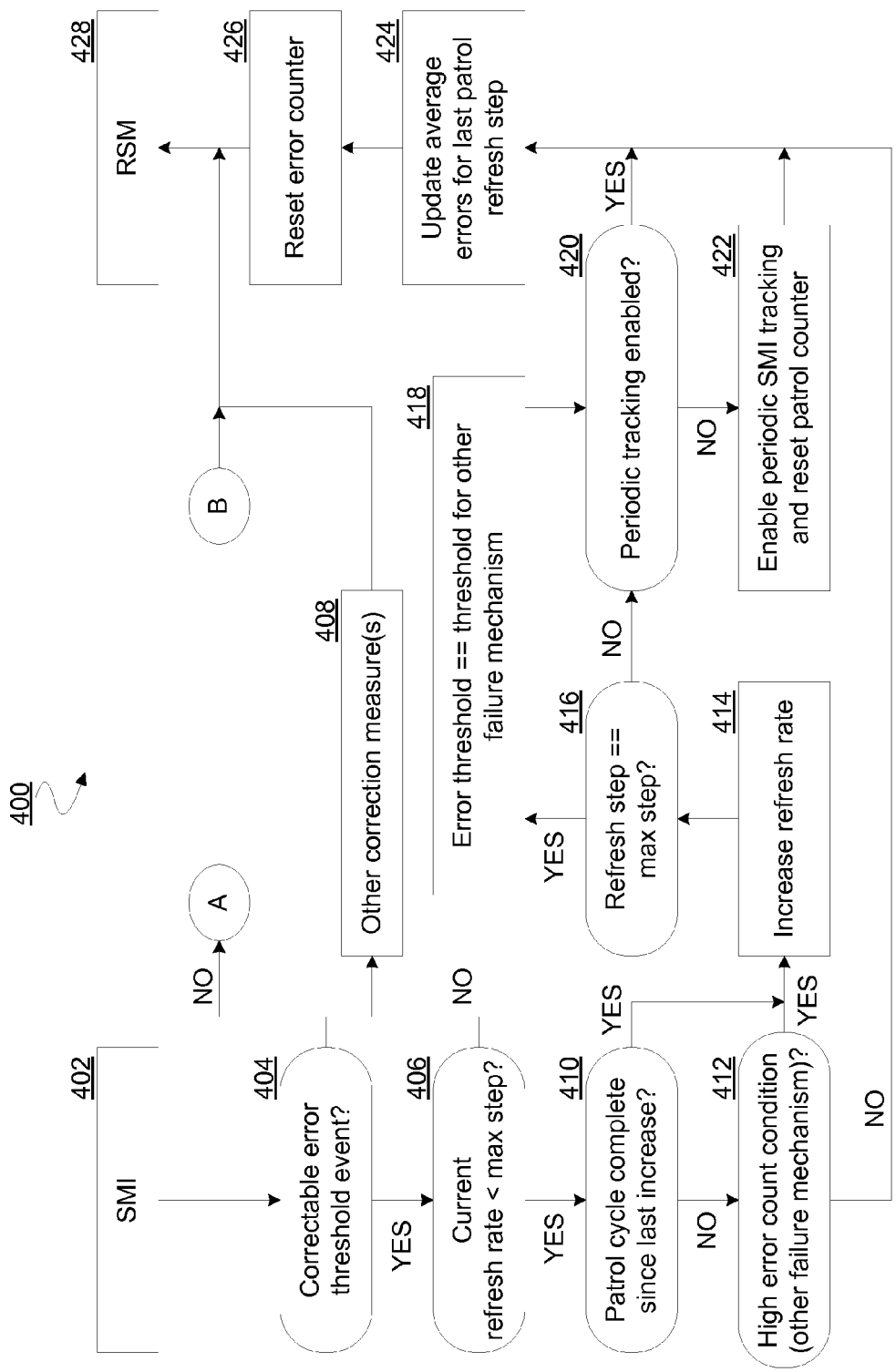
FIGS. 4A, 4B are flow diagrams illustrating elements of methods for timing memory refresh commands according to an embodiment.
Figure 4B:
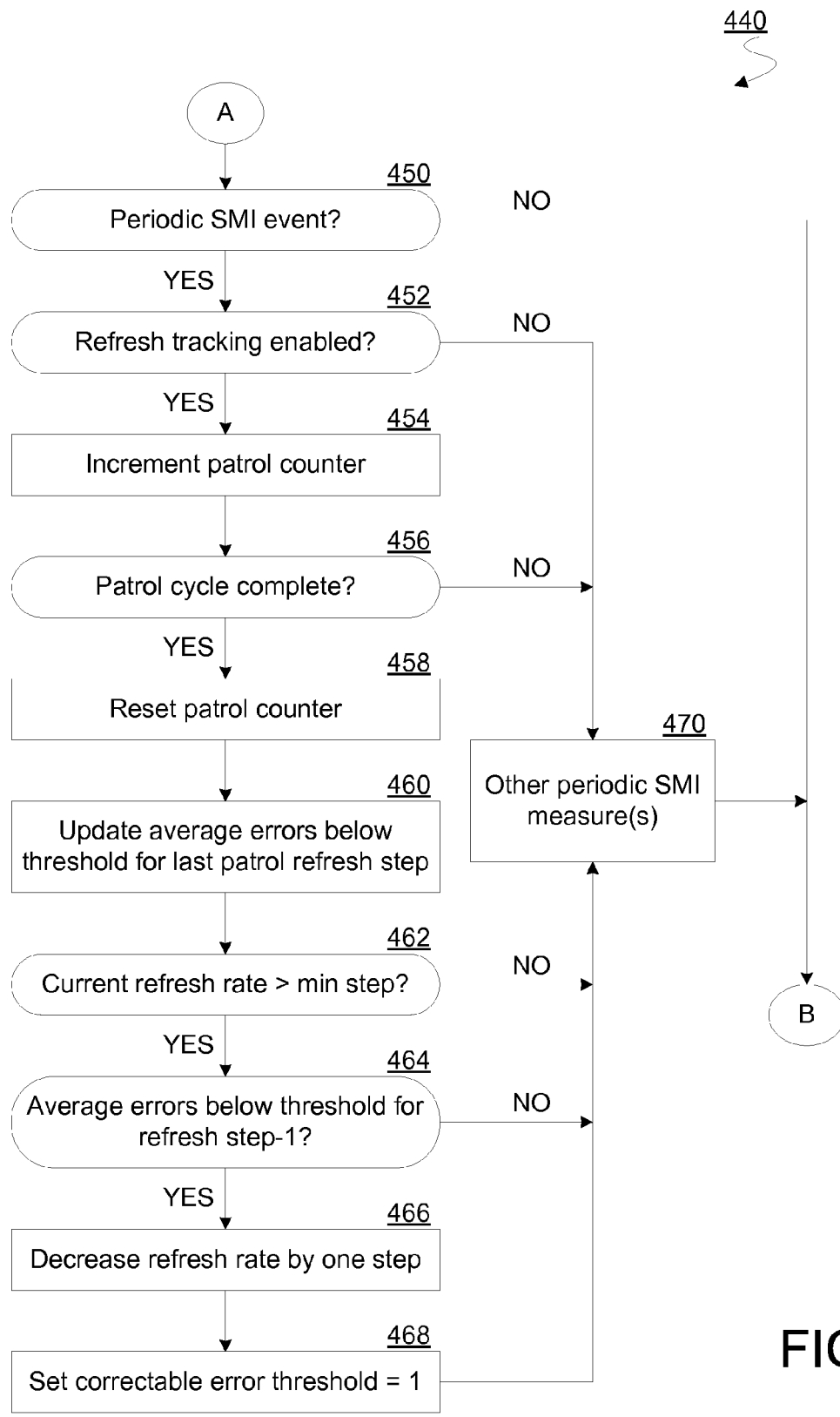

FIGS. 4A, 4B illustrates elements of respective methods 400, 440 for controlling accesses to a memory according to an embodiment. Methods 400, 440 may each be part of an overall algorithm for monitoring the rate of correctable data errors and tuning memory command timings to keep the error rate in a predetermined range according to an embodiment.

Referring to method 400, an SMI event may be detected at 402. The SMI event may be due to a correctable data error, a periodic timer or other system condition. If it is determined at 404 that the SMI event is due to an event regarding a correctable error threshold—e.g. a crossing of a threshold rate for correctable data errors—then method 400 may, according to certain conditions, perform some or all of increasing a rate of memory refreshes by one or more steps, at 414, setting a threshold error rate to a larger value that is associated with one or more other failure mechanisms, at 418, and enabling a periodic SMI tracking (and resetting a patrol counter), at 422.

For example, the respective performance of operations 414, 418, 422 may be variously predicated on one or more of a determination at 406 of whether the current refresh rate is less than a maximum rate to which the refresh rate may be stepped, a determination at 410 of whether a patrol cycle has completed since the most recent increase to the refresh rate, and a determination at 412 of whether there is a high data error count with respect to a threshold that is associated with another failure mechanism. Subsequent to any performance of operations 414, 418, 422, method 400 may update an average of data errors based on result of a last patrol refresh, at 424, and reset the error counter, at 426. As a result, a new refresh rate, after being stepped up at 414, may be used for one full patrol cycle before any subsequent refresh rate increase. During that patrol cycle, any new data errors are added to the average error count for the previous refresh rate.

In an embodiment, method 400 bypasses all operations 414, 418, 422 of a patrol cycle dwell requirement if, for example, it is determined at 406 that the current refresh rate at or above a maximum rate step. For example, method 400 may instead implement error mitigation measures, at 408, other than changing a timing setting to modify a memory refresh rate.

Referring now to method 440, operations are variously performed if, for example, method 400 determines at 404 that the SMI event is not due to a correctable error threshold event. For example, if it is determined at 450 that the SMI event at 402 is due to a periodic timer and it is further determined at 452 that refresh tracking is enabled, then method 440 may increment a patrol counter at 454 to determine, at 456, whether a full patrol cycle is complete. The patrol counter may, for example, be a software variable that is maintained by a BIOS in an SMI event handler.

In response to detecting completion of a patrol cycle, method 440 may reset the patrol counter at 458 and update the average of data errors, at 460. Method 400 may subsequently determine at 462 whether the current refresh rate is above a minimum step rate, and further determine, at 464, whether the data error average for the preceding refresh rate is below a given threshold. In response to the determining at 462, 464, method 400 may decrease the refresh rate by one step at 466 and reset the correctable error threshold to one, at 468. In an embodiment, the new refresh rate may be used for a predetermined number of one or more patrol cycles before any stepping down of the refresh rate is allowed again.

In an embodiment, methods 400, 440 support memory refresh rate setting and correctable error tracking independently per memory channel. Although the SMI event at 402 may cause a global interrupt for multiple processor cores, an SMI event handler of a BIOS or other such logic may track separate refresh state and error state on a per-memory channel basis.

Figure 5:
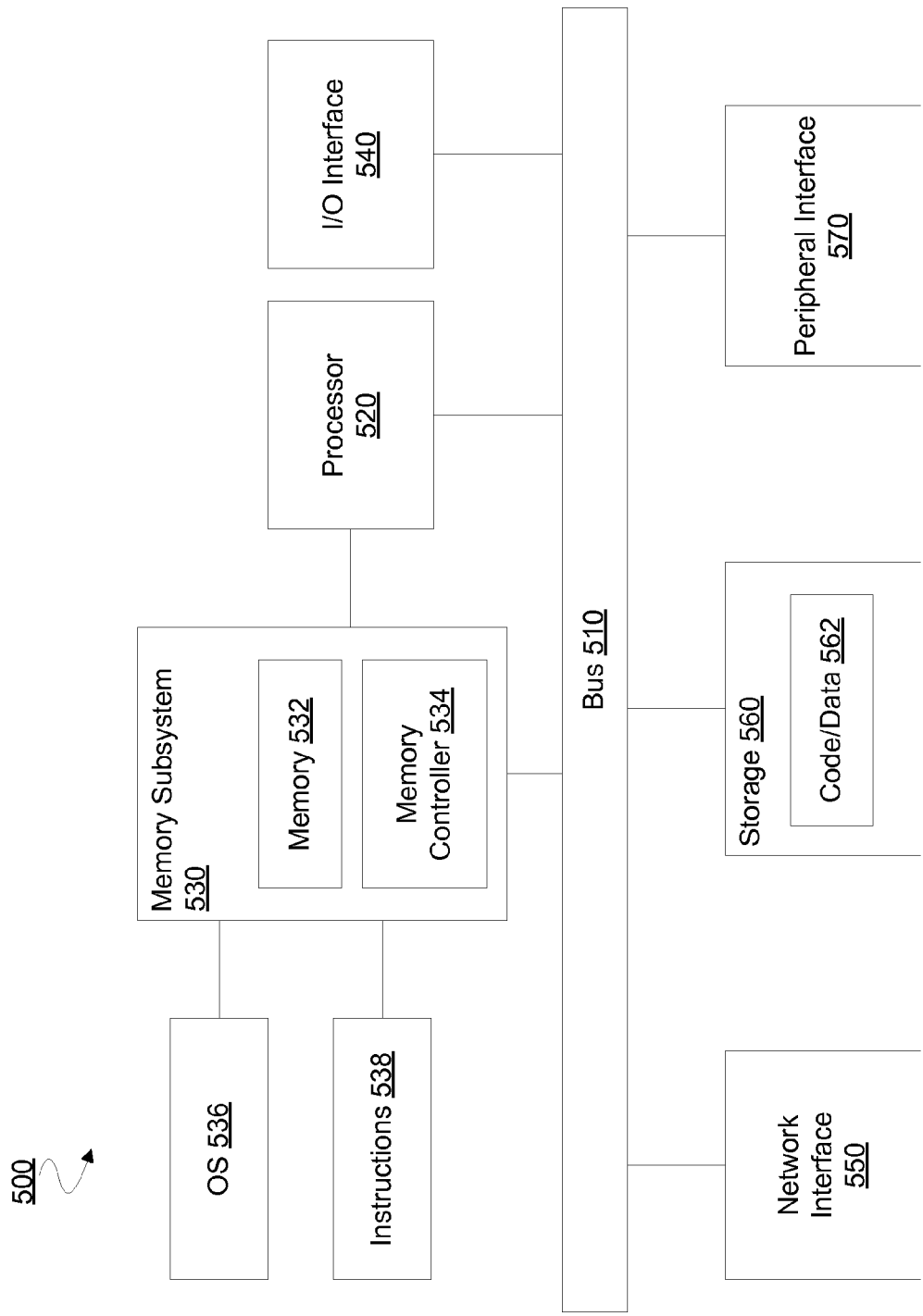
FIG. 5 is a block diagram illustrating elements of a computing system for generating commands to access memory resources according to an embodiment.

FIG. 5 is a block diagram of an embodiment of a computing system in which memory access timing may be implemented. System 500 represents a computing device in accordance with any embodiment described herein, and may be a laptop computer, a desktop computer, a server, a gaming or entertainment control system, a scanner, copier, printer, or other electronic device. System 500 may include processor 520, which provides processing, operation management, and execution of instructions for system 500. Processor 520 may include any type of microprocessor, central processing unit (CPU), processing core, or other processing hardware to provide processing for system 500. Processor 520 controls the overall operation of system 500, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 may include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 may include memory device 532 where it stores data, instructions, programs, or other items. In one embodiment, memory subsystem includes memory controller 534, which is a memory controller in accordance with any embodiment described herein, and which provides mechanisms for timing accesses to memory device 532. In one embodiment, memory controller 534 provides commands to memory device 532. The commands may be for memory device 532 to refresh volatile memory cells.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 may also correspond to interfaces in network interface 550.

System 500 may also include one or more input/output (I/O) interface(s) 540, network interface 550, one or more internal mass storage device(s) 560, and peripheral interface 570 coupled to bus 510. I/O interface 540 may include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 may include an Ethernet adapter, wireless interconnection components, USB (universal serial bus), or other wired or wireless standards-based or proprietary interfaces.

Storage 560 may be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 may be generically considered to be a "memory," although memory 530 is the executing or operating memory to provide instructions to processor 520. Whereas storage 560 is nonvolatile, memory 530 may include volatile memory (i.e., the value or state of the data is indeterminate if power is interrupted to system 500).

Peripheral interface 570 may include any hardware interface not specifically mentioned above. Peripherals refer generally to devices that connect dependently to system 500. A dependent connection is one where system 500 provides the software and/or hardware platform on which operation executes, and with which a user interacts.

Figure 6:
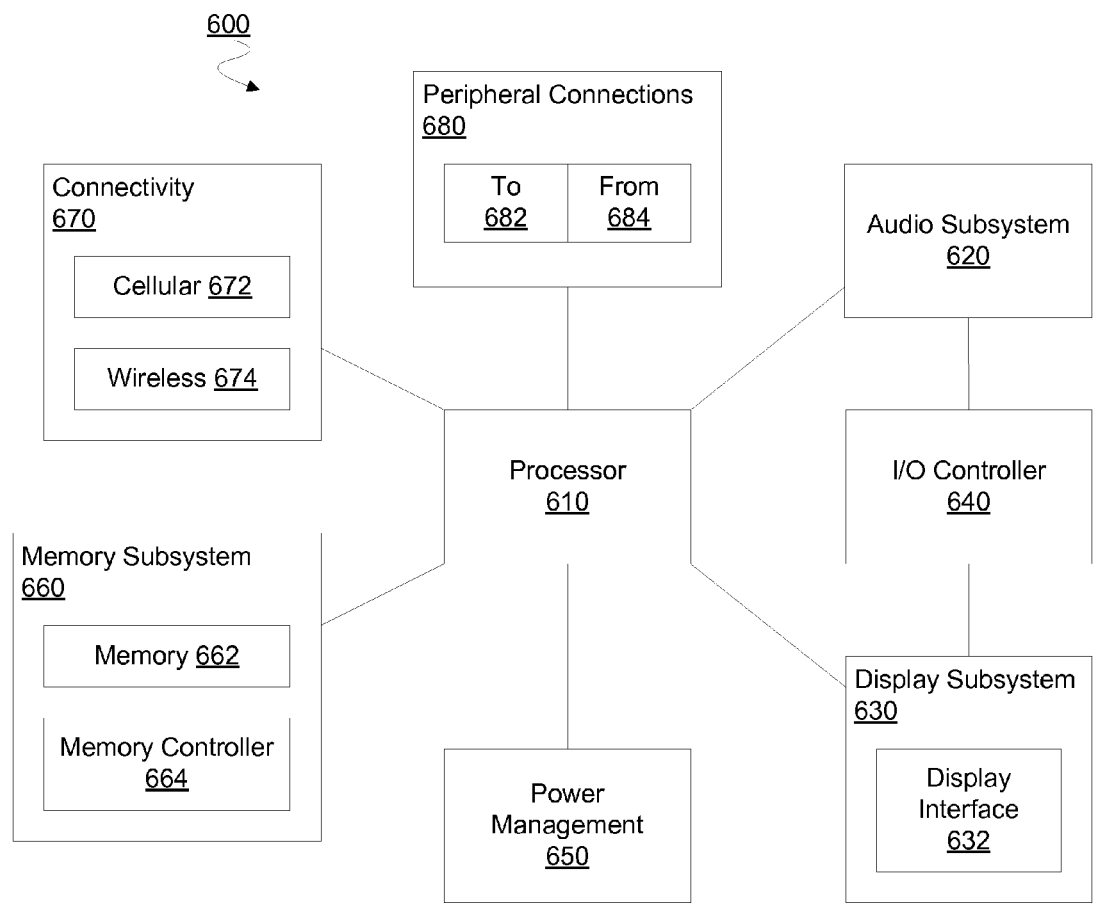
FIG. 6 is a block diagram illustrating elements of a mobile device for generating commands to access memory resources according to an embodiment.

FIG. 6 is a block diagram of an embodiment of a mobile device in which command timing may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 may include processor 610, which performs the primary processing operations of device 600. Processor 610 may include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 may include display interface 632, which may include the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 may operate to manage hardware that is part of audio subsystem 620 and/or display subsystem 630. Additionally, I/O controller 640 illustrates a connection point for additional devices that connect to device 600 through which a user might interact with the system. For example, devices that may be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620 and/or display subsystem 630. For example, input through a microphone or other audio device may provide input or commands for one or more applications or functions of device 600. Additionally, audio output may be provided instead of or in addition to display output. In another example, if display subsystem includes a touchscreen, the display device also acts as an input device, which may be at least partially managed by I/O controller 640. There may also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that may be included in device 600. The input may be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 may include memory device(s) 662 for storing information in device 600. Memory subsystem 660 may include nonvolatile (state does not change if power to the memory device is interrupted) and/or volatile (state is indeterminate if power to the memory device is interrupted) memory devices. Memory 660 may store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 monitors voltage swing characteristics of a bus. For example, memory controller 664 may detect different voltage swing characteristics for different signal lines of the same bus—e.g. a data bus. In an embodiment, memory controller 664 issues commands for memory 662 to refresh volatile memory cells.

Connectivity 670 may include hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 may include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector may allow device 600 to connect to certain peripherals that allow device 600 to control content output, for example, to audio-visual or other systems.

In addition to a proprietary docking connector or other proprietary connection hardware, device 600 may make peripheral connections 680 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one implementation, a memory controller comprises command logic to generate first commands to access a dynamic random access memory (DRAM) coupled to the memory controller, including the command logic to generate the first commands according to a first timing. The memory controller further comprises detect logic to monitor an error rate of the DRAM, to identify that the error rate is within a predetermined range, and to generate one or more signals in response to the error rate being within the predetermined range, the one or more signals to dynamically modify a command timing setting to transition from the first timing to a second timing. Based on the one or more signals, the command logic is to generate second commands according to the second timing, the second commands to access the DRAM.

In an embodiment, the detect logic to monitor the error rate comprises the detect logic to perform respective error checking and correction (ECC) calculations for each of the first commands, and the detect logic to maintain a count of data errors based on the respective ECC calculations. In another embodiment, the error rate is a rate of correctable errors. In another embodiment, the detect logic to monitor the error rate comprises the detect logic to monitor errors indicated by patrol scrub operations of a memory controller. In another embodiment, the detect logic to monitor the error rate comprises the detect logic to monitor errors indicated by demand scrub operations of a memory controller. In another embodiment, the one or more signals includes a system management interrupt (SMI).

In another embodiment, the detect logic to identify that the error rate is within the predetermined range includes the detect logic to identify that a count of data errors has crossed a threshold. In another embodiment, the detect logic to identify that the error rate is within the predetermined range is based on a periodic timer. In another embodiment, the one or more signals increase a refresh rate for the DRAM. In another embodiment, the one or more signals decrease a refresh rate for the DRAM. In another embodiment, the detect logic is further to identify, subsequent to generation of the one or more signals, that the error rate remains within the predetermined range, and in response to the error rate remaining within the predetermined range, activate an error handling mechanism other than one based on the command timing setting. In another embodiment, the detect logic to activate the error handling mechanism comprises the detect logic to dynamically configure an error threshold. In another embodiment, the detect logic is further to identify, subsequent to generation of the one or more signals, that the error rate is within the predetermined range, and in response to identifying that the error rate is within the predetermined range, to generate another signal to dynamically modify the command timing setting to transition from the second timing.

In another implementation, a method comprises monitoring an error rate of a dynamic random access memory (DRAM) during runtime operation of the DRAM, and based on the monitoring, identifying that the error rate is within a predetermined range. The method further comprises, in response to identifying that the error rate is within the predetermined range, generating one or more signals to dynamically modify a command timing setting to transition from a first timing for first commands to access the DRAM to a second timing for second commands to access the DRAM.

In an embodiment, monitoring the error rate comprises performing respective error checking and correction (ECC) calculations for each of the first commands, and maintaining of count of data errors based on the respective error checking and correction (ECC) calculations. In another embodiment, the error rate is a rate of correctable errors. In another embodiment, monitoring the error rate comprises monitoring errors indicated by patrol scrub operations of a memory controller. In another embodiment, monitoring the error rate comprises monitoring errors indicated by demand scrub operations of a memory controller. In another embodiment, the one or more signals includes a system management interrupt (SMI).

In another embodiment, identifying that the error rate is within the predetermined range includes identifying that a count of data errors has crossed a threshold. In another embodiment, identifying that the error rate is within the predetermined range is based on a periodic timer. In another embodiment, the one or more signals increase a refresh rate for the DRAM. In another embodiment, the one or more signals decrease a refresh rate for the DRAM. In another embodiment, the method further comprises, subsequent to the generating the one or more signals, identifying that the error rate remains within the predetermined range, and in response to identifying that the error rate remains within the predetermined range, activating an error handling mechanism other than one based on the command timing setting. In another embodiment, activating the error handling mechanism comprises dynamically configuring an error threshold for the memory controller. In another embodiment, the method further comprises, subsequent to the generating the one or more signals, identifying based on the monitoring that the error rate is within the predetermined range, and in response to identifying that the error rate is within the predetermined range, generating another signal to dynamically modify the command timing setting to transition from the second timing.

In another implementation, a computer-readable storage medium has stored thereon instructions which, when executed by one or more processing units, cause the one or more processing units to perform a method comprising monitoring an error rate of a dynamic random access memory (DRAM) during runtime operation of the DRAM. The method further comprises, based on the monitoring, identifying that the error rate is within a predetermined range, and in response to identifying that the error rate is within the predetermined range, generating one or more signals to dynamically modify a command timing setting to transition from a first timing for first commands to access the DRAM to a second timing for second commands to access the DRAM.

In an embodiment, monitoring the error rate comprises performing respective error checking and correction (ECC) calculations for each of the first commands, and maintaining of count of data errors based on the respective error checking and correction (ECC) calculations. In another embodiment, the error rate is a rate of correctable errors. In another embodiment, monitoring the error rate comprises monitoring errors indicated by patrol scrub operations of a memory controller. In another embodiment, monitoring the error rate comprises monitoring errors indicated by demand scrub operations of a memory controller. In another embodiment, the one or more signals includes a system management interrupt (SMI).

In another embodiment, identifying that the error rate is within the predetermined range includes identifying that a count of data errors has crossed a threshold. In another embodiment, identifying that the error rate is within the predetermined range is based on a periodic timer. In another embodiment, the one or more signals increase a refresh rate for the DRAM. In another embodiment, the one or more signals decrease a refresh rate for the DRAM. In another embodiment, the method further comprises, subsequent to the generating the one or more signals, identifying that the error rate remains within the predetermined range, and in response to identifying that the error rate remains within the predetermined range, activating an error handling mechanism other than one based on the command timing setting. In another embodiment, activating the error handling mechanism comprises dynamically configuring an error threshold for the memory controller. In another embodiment, the method further comprises, subsequent to the generating the one or more signals, identifying based on the monitoring that the error rate is within the predetermined range, and in response to identifying that the error rate is within the predetermined range, generating another signal to dynamically modify the command timing setting to transition from the second timing.

In another implementation, a system comprises a dynamic random access memory (DRAM), a command-address bus, and a memory controller coupled to the DRAM via the command-address bus. The memory controller includes command logic to generate first commands to access the DRAM, including the command logic to generate the first commands according to a first timing, and detect logic to monitor an error rate of the DRAM, to identify that the error rate is within a predetermined range, and to generate one or more signals in response to the error rate being within the predetermined range, the one or more signals to dynamically modify a command timing setting to transition from the first timing to a second timing. Based on the one or more signals, the command logic is to generate second commands according to the second timing, the second commands to access the DRAM.

In an embodiment, the detect logic to monitor the error rate comprises the detect logic to perform respective error checking and correction (ECC) calculations for each of the first commands, and the detect logic to maintain a count of data errors based on the respective ECC calculations. In another embodiment, the error rate is a rate of correctable errors. In another embodiment, the detect logic to monitor the error rate comprises the detect logic to monitor errors indicated by patrol scrub operations. In another embodiment, the detect logic to monitor the error rate comprises the detect logic to monitor errors indicated by demand scrub operations. In another embodiment, the one or more signals includes a system management interrupt (SMI).

In another embodiment, the detect logic to identify that the error rate is within the predetermined range includes the detect logic to identify that a count of data errors has crossed a threshold. In another embodiment, the detect logic to identify that the error rate is within the predetermined range is based on a periodic timer. In another embodiment, the one or more signals increase a refresh rate for the DRAM. In another embodiment, the one or more signals decrease a refresh rate for the DRAM. In another embodiment, the detect logic is to further to identify, subsequent to generation of the one or more signals, that the error rate remains within the predetermined range, and in response to the error rate remaining within the predetermined range, activate an error handling mechanism other than one based on the command timing setting. In another embodiment, the detect logic to activate the error handling mechanism comprises the detect logic to dynamically configure an error threshold. In another embodiment, the detect logic is further to identify, subsequent to generation of the one or more signals, that the error rate is within the predetermined range, and in response to identifying that the error rate is within the predetermined range, generating another signal to dynamically modify the command timing setting to transition from the second timing.

Techniques and architectures for controlling a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus.

Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory controller comprising:
command logic to generate first commands to access a dynamic random access memory (DRAM) coupled to the memory controller, including the command logic to generate the first commands according to a first timing; and
detect logic to monitor an error rate of the DRAM and to send to a basic input output system (BIOS) an indication of the error rate, wherein based on the indication, the BIOS to identify that the error rate is within a predetermined range and generates one or more signals in response to the error rate being within the predetermined range, the one or more signals to dynamically modify a command timing setting to transition from the first timing to a second timing, wherein, based on the one or more signals, the command logic to generate second commands according to the second timing, the second commands to access the DRAM.

2. The memory controller of claim 1, wherein the detect logic to monitor the error rate comprises:
the detect logic to perform respective error checking and correction (ECC) calculations for each of the first commands; and
the detect logic to maintain a count of data errors based on the respective ECC calculations.

3. The memory controller of claim 1, wherein the error rate is a rate of correctable errors.

4. The memory controller of claim 1, wherein the one or more signals increase a refresh rate for the DRAM.

5. The memory controller of claim 1, wherein the one or more signals decrease a refresh rate for the DRAM.

6. The memory controller of claim 1, wherein the detect logic to monitor the error rate comprises the detect logic to monitor errors indicated by patrol scrub operations of the memory controller.

7. The memory controller of claim 1, wherein the detect logic to monitor the error rate comprises the detect logic to monitor errors indicated by demand scrub operations of the memory controller.

8. The memory controller of claim 1, wherein the one or more signals includes a system management interrupt (SMI).

9. The memory controller of claim 1, wherein the detect logic to identify that the error rate is within the predetermined range includes the detect logic to identify that a count of data errors has crossed a threshold.

10. The memory controller of claim 1, wherein the detect logic to identify that the error rate is within the predetermined range is based on a periodic timer.

11. The memory controller of claim 1, the detect logic further to:
    identify, subsequent to generation of the one or more signals, that the error rate is within the predetermined range; and
    in response to identifying that the error rate is within the predetermined range, generate another signal to dynamically modify the command timing setting to transition from the second timing.

12. A method at a memory controller, the method comprising:
    generating first commands to access a dynamic random access memory (DRAM) coupled to the memory controller, including generating the first commands according to a first timing;
    monitoring an error rate of a dynamic random access memory (DRAM) during runtime operation of the DRAM; and
    based on the monitoring, sending from the memory controller to a basic input output system (BIOS) an indication that the error rate is within a predetermined range, generating at, wherein, in response to the indication, the BIOS generates one or more signals to dynamically modify a command timing setting to transition from a first timing for first commands to access the DRAM to a second timing for second commands to access the DRAM.

13. The method of claim 12, wherein monitoring the error rate comprises:
    performing respective error checking and correction (ECC) calculations for each of the first commands; and
    maintaining of count of data errors based on the respective error checking and correction (ECC) calculations.

14. The method of claim 12, wherein the error rate is a rate of correctable errors.

15. The method of claim 12, wherein the one or more signals changes a refresh rate for the DRAM.

16. The method of claim 12, wherein monitoring the error rate comprises monitoring errors indicated by patrol scrub operations of the memory controller.

17. The method of claim 12, wherein monitoring the error rate comprises monitoring errors indicated by demand scrub operations of the memory controller.

18. A computer-readable storage medium having stored thereon instructions which, when executed by one or more processing units, cause the one or more processing units to perform a method at a memory controller, the method comprising:
    generating first commands to access a dynamic random access memory (DRAM) coupled to the memory controller, including generating the first commands according to a first timing;
    monitoring an error rate of a dynamic random access memory (DRAM) during runtime operation of the DRAM; and
    based on the monitoring, sending from the memory controller to a basic input output system (BIOS) that the error rate is within a predetermined range, wherein, in response to the indication, the BIOS generates one or more signals to dynamically modify a command timing setting to transition from a first timing for first commands to access the DRAM to a second timing for second commands to access the DRAM.

19. The computer-readable storage medium of claim 18, wherein monitoring the error rate comprises:
    performing respective error checking and correction (ECC) calculations for each of the first commands; and
    maintaining of count of data errors based on the respective error checking and correction (ECC) calculations.

20. The computer-readable storage medium of claim 18, wherein the error rate is a rate of correctable errors.

21. The computer-readable storage medium of claim 18, wherein the one or more signals changes a refresh rate for the DRAM.

22. A system comprising:
    a dynamic random access memory (DRAM);
    a command-address bus; and
    a memory controller coupled to the DRAM via the command-address bus, the memory controller including:
        command logic to generate first commands to access the DRAM, including the command logic to generate the first commands according to a first timing; and
        detect logic to monitor an error rate of the DRAM and to send to a basic input output system (BIOS) an indication of the error rate, wherein based on the indication, the BIOS to identify that the error rate is within a predetermined range and generates one or more signals in response to the error rate being within the predetermined range, the one or more signals to dynamically modify a command timing setting to transition from the first timing to a second timing, wherein, based on the one or more signals, the command logic to generate second commands according to the second timing, the second commands to access the DRAM.

23. The system of claim 22, wherein the detect logic to monitor the error rate comprises:
    the detect logic to perform respective error checking and correction (ECC) calculations for each of the first commands; and
    the detect logic to maintain a count of data errors based on the respective ECC calculations.

24. The system of claim 22, wherein the error rate is a rate of correctable errors.

25. The system of claim 22, wherein the one or more signals changes a refresh rate for the DRAM.

* * * * *